United States Patent
Sato et al.

(10) Patent No.: US 7,912,152 B2
(45) Date of Patent: Mar. 22, 2011

(54) COMPLEX COEFFICIENT TRANSVERSAL FILTER AND COMPLEX FREQUENCY CONVERTER

(75) Inventors: Takahiro Sato, Yokohama (JP); Tsuyoshi Sugiura, Yokohama (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 1034 days.

(21) Appl. No.: 11/640,496

(22) Filed: Dec. 18, 2006

(65) Prior Publication Data

US 2007/0140328 A1 Jun. 21, 2007

(30) Foreign Application Priority Data

Dec. 16, 2005 (JP) ................................ 2005-363175
Oct. 19, 2006 (KR) ........................ 10-2006-0102037

(51) Int. Cl.
H04L 27/00 (2006.01)
(52) U.S. Cl. ......... 375/324; 375/229; 375/322; 375/326
(58) Field of Classification Search .................. 375/324, 375/322, 326, 229; 333/193; 257/222, 249, 257/241; 357/26, 15, 24
See application file for complete search history.

(56) References Cited

U.S. PATENT DOCUMENTS

| | | | | | |
|---|---|---|---|---|---|
| 4,010,360 | A | * | 3/1977 | Alsup et al. | 708/821 |
| 4,100,498 | A | * | 7/1978 | Alsup et al. | 327/105 |
| 4,329,651 | A | * | 5/1982 | Alsup | 327/105 |
| 4,660,087 | A | * | 4/1987 | Rumreich | 348/737 |
| 5,132,985 | A | * | 7/1992 | Hashimoto et al. | 375/151 |
| 5,440,155 | A | * | 8/1995 | Hunsinger et al. | 257/241 |
| 5,596,606 | A | * | 1/1997 | Montreuil | 375/327 |
| 6,344,705 | B1 | * | 2/2002 | Solal et al. | 310/313 B |
| 6,384,698 | B1 | * | 5/2002 | Hayashi et al. | 333/195 |
| 6,570,471 | B2 | * | 5/2003 | Inoue et al. | 333/195 |
| 6,629,121 | B1 | * | 9/2003 | Ishikawa et al. | 708/815 |
| 6,965,282 | B2 | * | 11/2005 | Kawachi et al. | 333/193 |
| 2002/0057141 | A1 | * | 5/2002 | Nishizawa et al. | 333/193 |
| 2002/0079988 | A1 | * | 6/2002 | Endou et al. | 333/193 |
| 2003/0035557 | A1 | * | 2/2003 | Takamine et al. | 381/111 |
| 2003/0197810 | A1 | * | 10/2003 | Jaffe | 348/726 |
| 2004/0095206 | A1 | * | 5/2004 | Tsutsumi et al. | 333/133 |
| 2008/0007370 | A1 | * | 1/2008 | Matsumoto | 333/194 |

FOREIGN PATENT DOCUMENTS

EP 742655 A1 * 11/1996

* cited by examiner

*Primary Examiner* — Shuwang Liu
*Assistant Examiner* — Helene Tayong
(74) *Attorney, Agent, or Firm* — NSIP Law (57) ABSTRACT

A complex coefficient transversal filter using a SAW filter and a complex frequency converter using the complex coefficient transversal filter are provided, in which a first SAW filter receives a real signal as an input signal and generates a real component of a complex signal, and a second SAW filter receives the real signal as an input signal and generates an imaginary component of the complex signal. Accordingly, feed-through waves between the input and output stages can be cancelled, and a phase difference between real and imaginary signals can be maintained at 90° without a phase shift. In addition, when a low-IF frequency converter is implemented using the complex coefficient transversal filter, an image suppression characteristic is improved. When a zero-IF frequency converter is implemented using the complex coefficient transversal filter, an error vector magnitude (EVM) characteristic is improved.

19 Claims, 9 Drawing Sheets

COMPLEX COEFFICIENT TRANSVERSAL FILTER AND COMPLEX FREQUENCY CONVERTER

CROSS-REFERENCE TO RELATED PATENT APPLICATION

This application claims the benefit under 35 U.S.C. §119(a) of Japanese Patent Application No. 2005-363175, filed on Dec. 16, 2005, in the Japanese Intellectual Property Office, and the benefit of Korean Patent Application No. 10-2006-0102037, filed on Oct. 19, 2006, in the Korean Intellectual Property Office, the entire disclosures of both of which are hereby incorporated by reference.

BACKGROUND OF THE INVENTION

1. Field of the Invention

The present invention relates to a complex coefficient transversal filter and a complex frequency converter. More particularly, the present invention relates to a complex coefficient transversal filter using a surface acoustic wave (SAW) filter suitable for implementing a high-frequency complex coefficient filter for a high-performance radio communication terminal and a complex frequency converter using the complex coefficient transversal filter.

2. Description of the Related Art

A front end of a receiver performs frequency conversion on a radio frequency (RF) signal and selects a desired signal. The front end may be a heterodyne system using an intermediate frequency (IF) signal, a zero-IF system (a direct conversion system) which converts an RF signal into a baseband signal, and a low-IF system using an image rejection mixer which suppresses an image signal with a mixer.

[Heterodyne System]

In the heterodyne system, in order to prevent an image signal interference, the IF frequency is designed to be increased to increase a frequency difference between a target RF signal and an image frequency signal and to suppress the image frequency signal with an RF filter. For example, in a full duplex transceiver where a receiver and a transmitter operate simultaneously, an image of a transmission signal when a transmission local signal and a receptional local signal is commonly used needs to be suppressed, and large interference from an outside band of a system frequency band, which cannot be suppressed with an RF filter needs to be prevented. Therefore, different IF frequencies are used for different radio communication systems. In such a multi-mode transceiver, since separate IF filters are needed in order to provide different channel bandwidths for different modes, a problem exists in that a circuit size increases greatly.

[Zero-IF System]

The zero-IF system is suitable for a small-sized system because an IF filter can be formed in an integrated chip (IC). However, in the zero-IF system, since the RF signal is converted into a baseband signal, an IM2 problem exists, that is, a problem of second-order inter-modulation distortion caused by DC offset after frequency conversion and nonlinearity of a mixer. In turn, a problem of deterioration in an error vector magnitude (EVM) characteristic exists. The deterioration in the EVM characteristic is caused by a signal of a mixer and a signal generated from a local signal not being perpendicular to each other. In order to solve the problem, a circuit has been developed which can reduce an amplitude error and a phase error between I and Q components of the local signal (hereinafter, simply referred to as "between I and Q") and reduce an error between transistors of the mixer. In addition, various techniques have been developed to compensate for errors between I and Q by converting a complex baseband signal into a digital signal and performing a digital signal process.

However, due to incompleteness of an analog circuit, there is a limitation to improve the errors between I and Q. For example, in multi-level modulation, a deterioration caused by interference between symbols exists, and in an orthogonal frequency division multiplexing (OFDM), a problem of interference between carriers exists. In a multiple-input multiple-output (MIMO) system, which is a type of communication system in a wireless LAN due to the incompleteness of the analog circuit, a limitation to increase communication speed exists.

[Low-IF System]

In the low-IF system, the image rejection mixer is used for the frequency conversion process to suppress a signal whose frequency is located on the opposite side of a frequency of the local signal with respect to a frequency of the target signal. The low-IF system can suppress the image frequency signal irrespective of the frequency characteristics of the RF and IF filters. Since an image suppression ratio does not depend on the characteristic of the RF filter, the IF filter having a shape characteristic is not required, and an IF frequency can be lowered. In addition, a frequency interval between the target frequency signal and the image frequency signal becomes double the IF frequency. Therefore, when the IF frequency is equal to the channel interval, the image frequency of the target channel corresponds to an adjacent channel next to the target channel.

Required specifications of a radio communication system using a down converter can be attained when a specification for blocking of an image frequency signal having a frequency twice as large as the IF frequency is below the image suppression ratio. In the low-IF system, since the IF frequency is low, an IF filter can be constructed with an active filter. In addition, the low-IF system can be constructed as a small-sized system formed in an IC. In addition, since different IF frequencies are required for different radio communication systems, the IF frequency can be commonly used for a multi-mode transceiver. Although the frequency can be fixed, the frequency band cannot be fixed. However, in such a gmC filter, a filter characteristic can be implemented in a variable manner so that a multi-mode system can be implemented without a plurality of filters.

However, in a conventional low-IF system, the image suppression ratio is about 30 dB (see Phillips Datasheets SA1920 and SA1921), which is too low. Due to the low image suppression ratio, the low-IF system can be used in radio communication systems in which poor blocking of the image frequency signal is tolerable. However, the conventional low-IF system cannot be used for a system requiring an image suppression ratio exceeding 30 dB.

Accordingly, there is a need for an improved complex frequency converter comprising a complex coefficient transversal filter that obtains an improved image suppression characteristic.

SUMMARY OF THE INVENTION

An aspect of exemplary embodiments of the present invention is to address at least the above problems and/or disadvantages and to provide at least the advantages described below. Accordingly, an aspect of exemplary embodiments of the present invention is to provide a complex coefficient transversal filter capable of maintaining a phase difference between real and imaginary components to be 90° without a phase shift and obtaining a good image suppression characteristic, so that it is possible to improve an error vector magnitude (EVM) characteristic of a zero-IF frequency converter and to improve an image suppression characteristic of a low-IF frequency converter.

Exemplary embodiments of the present invention provide a complex frequency converter using the complex coefficient transversal filter.

According to an aspect of exemplary embodiments of the present invention, there is provided a complex coefficient transversal filter, in which, a first SAW filter receives a real signal as an input signal and generates a real component of a complex signal; and a second SAW filter receives the real signal as an input signal and generates an imaginary component of the complex signal, wherein each of the first and second SAW filters drives an input stage for the real signal or an output stage for the complex signal in a balance mode.

According to another aspect of exemplary embodiments of the present invention, there is provided a complex frequency converter, in which, a complex coefficient transversal filter including a first SAW filter receives a real signal as an input signal and generates a real component of a complex signal, and a second SAW filter receives the real signal as an input signal and generates an imaginary component of the complex signal, wherein each of the first and second SAW filters drives an input stage or an output state in a balance mode; a local oscillator generates a complex local signal having a predetermined frequency; and a complex mixer, connected to the complex coefficient transversal filter and the local oscillator, performs frequency conversion by multiplying the complex signal output from the complex coefficient transversal filter with the local signal output from the local oscillator.

BRIEF DESCRIPTION OF THE DRAWINGS

The above and other objects, features and advantages of certain exemplary embodiments of the present invention will be more apparent from the following description taken in conjunction with the accompanying drawings, in which.

Throughout the drawings, the same drawing reference numerals will be understood to refer to the same elements, features and structures.

DETAILED DESCRIPTION OF EXEMPLARY EMBODIMENTS

The matters defined in the description such as a detailed construction and elements are provided to assist in a comprehensive understanding of exemplary embodiments of the invention. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

Figure 1:
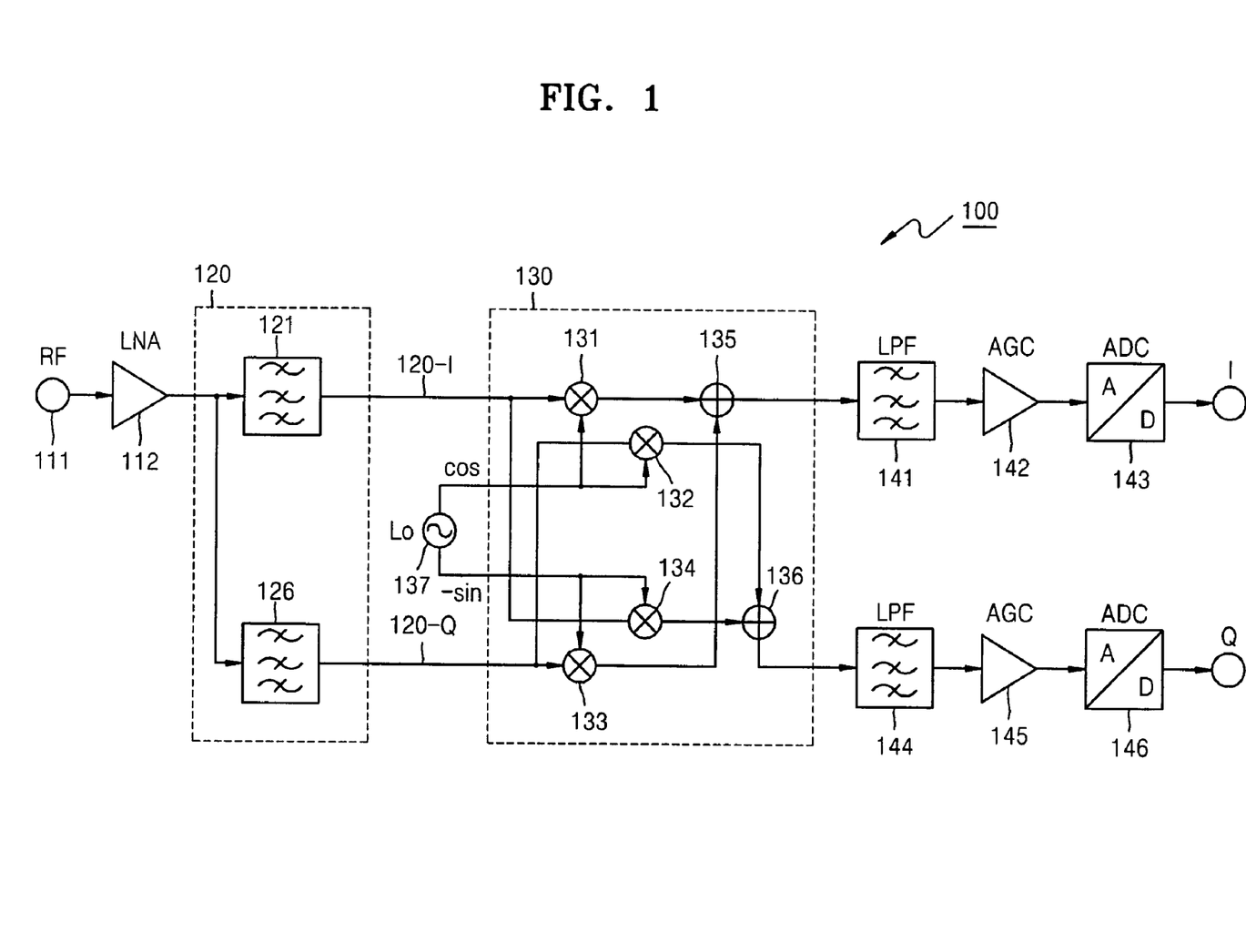
FIG. 1 is a view showing a construction of a complex frequency converter according to an exemplary embodiment of the present invention.

FIG. 1 is a schematic view showing a construction of a complex frequency converter 100 according to an exemplary embodiment of the present invention.

The complex frequency converter 100 according to an exemplary embodiment of the present invention includes an antenna 111, a low noise amplifier (LNA) 112, a complex coefficient transversal filter 120, a complex mixer 130, low pass filers (LPFs) 141 and 144, automatic gain controllers (AGCs) 142 and 145, and analog-to-digital converters (ADCs) 143 and 146. In FIG. 1, the essential components of the complex frequency converter 100 are shown, and a description of other components not shown is omitted for clarity and conciseness.

The LNA 112 is an amplifier which amplifies a radio frequency (RF) signal input from the antenna 111. Since the RF signal input from the antenna contains external noise, the LNA 112 minimizes the noise and amplifies the RF signal.

The complex coefficient transversal filter 120 is a filter which suppresses a positive or negative frequency component. The complex coefficient transversal filter 120 includes two surface acoustic wave (SAW) filters 121 and 126. The first SAW filter 121 generates a real component 120-I of a complex signal by performing convolution integration of an input signal and an even-symmetry impulse response. The second SAW filter 126 generates an imaginary component 120-Q of the complex signal by performing convolution integration on the input signal and an odd-symmetry impulse response. The complex coefficient transversal filter 120 will be described later in detail with reference to FIGS. 2 and 8.

The complex mixer 130 mixes a local signal with the complex signal of the complex coefficient transversal filter 120 and performs complex frequency conversion. The (full) complex mixer 130 includes first through fourth multipliers 131 to 134, and first and second adders (or subtractors) 135 and 136.

The complex mixer 130 receives a real local signal (a cosine signal) and an imaginary local signal (a minus (−) sine signal) from a local oscillator 137. The frequency of the complex local signal generated by the local oscillator 137 is adjusted to be in a frequency range excluding the frequency of the input signal. The complex mixer 130 performs the frequency conversion of the complex signal from the local oscillator 137 so that a frequency thereof becomes zero-frequency or near-zero-frequency.

The LPF 141 is a filter which removes a high frequency component of the complex signal. The complex signal from which the high frequency component is removed by the LPF 141 is processed by the AGC 142 and the ADC 143 and output as a real component of a complex baseband signal through an output terminal I. The LPF 144 shown in the lower part of FIG. 1 also removes the high frequency component of the complex signal. The complex signal from which the high frequency component is removed by the LPF 144 is processed by the AGC 145 and the ADC 146 and output as an imaginary component of the complex baseband signal through an output terminal Q.

The complex frequency converter 100 according to an exemplary embodiment of the present invention has the aforementioned construction. Hereinafter, the complex coefficient transversal filter 120, which is a characteristic element of the complex frequency converter 100, will be described in detail.

Figure 2:
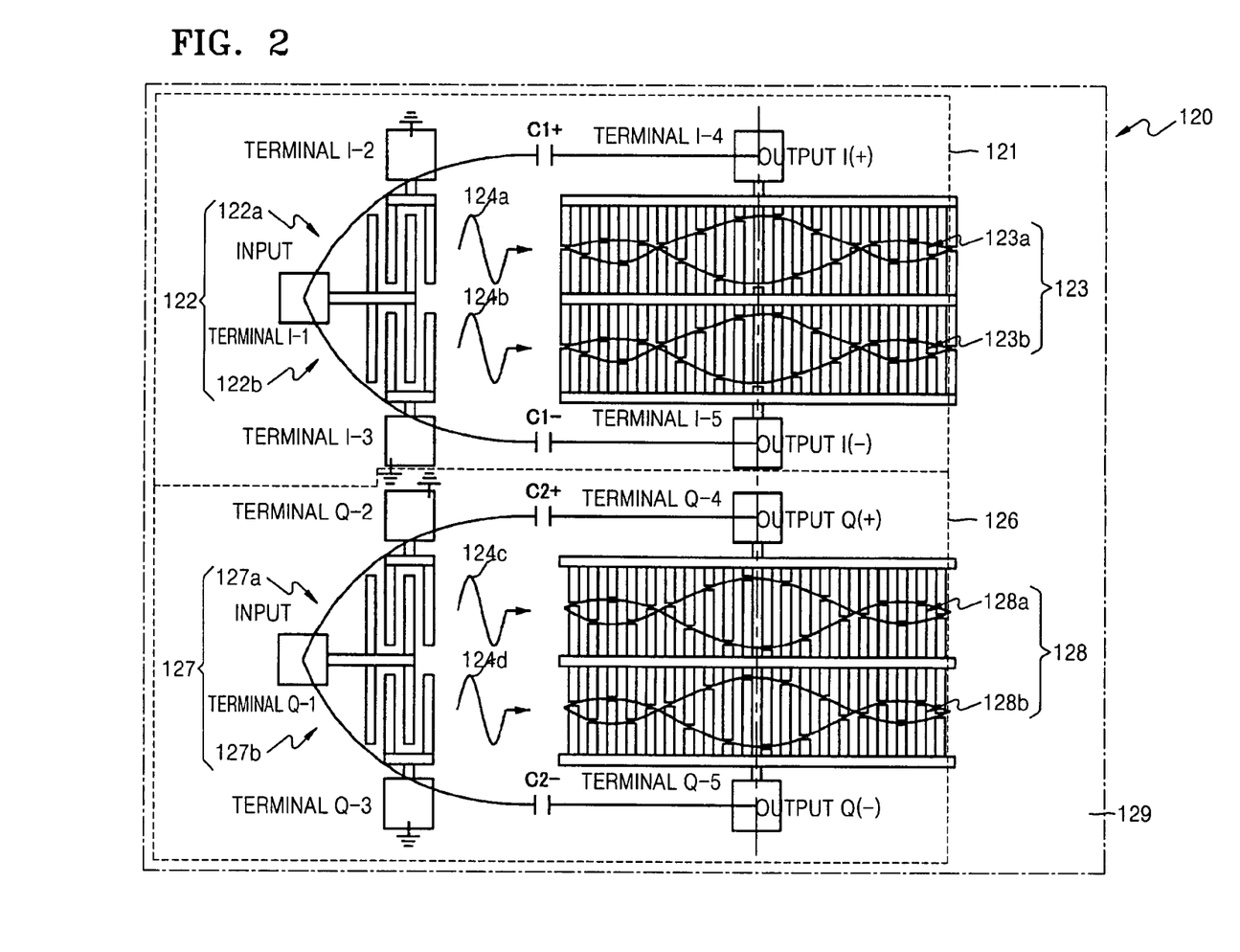
FIG. 2 is a view showing a construction of a complex coefficient transversal filter according to an exemplary embodiment of the present invention.

FIG. 2 is a view showing a construction of the complex coefficient transversal filter 120 according to an exemplary embodiment of the present invention.

The complex coefficient transversal filter 120 which receives a real signal as an input signal generates a complex signal which is phase-shifted by 90°. The complex coefficient transversal filter 120 may be constructed with a transversal SAW filter. The complex coefficient transversal filter 120 according to an exemplary embodiment of the present invention may also be constructed with a switched capacitor circuit or a charge area device instead of the SAW filter. However, the SAW filter is most suitable for implementing a high-frequency complex coefficient filter.

[Transversal SAW Filter]

The principle of the transversal SAW filter will now be described. The SAW filter includes an inter-digital transducer (IDT) where comb-like electrodes having different intersection widths are disposed on a piezoelectric substrate. When an impulse of an electrical signal is applied to the input-stage transducer, mechanical distortion occurs on the transducer due to piezoelectricity, and the SAW is generated and propagated in left and right directions of the substrate.

An impulse response of the SAW signal propagating from the input-stage IDT depends on weighting functions (intersection widths) Wi of a plurality of taps, distances xi from the tap, and a phase velocity of the SAW. The associated frequency transfer function H(ω) is represented by Equation 1.

$$H(\omega) = \sum_{i=0}^{n} W_i \exp\left(-\frac{j\omega x_i}{v}\right)$$ [Equation 1]

Equation 1 shows a basic principle of a transversal SAW filter. The impulse response of the SAW filter has a characteristic of a liner combination of the weighting functions Wi. In the transversal SAW filter, the SAW signal generated by the input-stage transducer is converted into an electrical signal by another transducer which is disposed in a propagation path of the SAW signal, so that desired filtering is performed. In order to obtain a signal suitable for a desired degree of filtering in Equation 1, amplitude and phase characteristics need to be controlled independently by circuit design of the weighting functions Wi and the distances xi. As a result, a complex coefficient transversal filter having a bandpass characteristic can be implemented.

The complex coefficient transversal filter 120, which is implemented based on the above principle, is a filter which transforms a real signal as an input signal to a complex signal. The complex coefficient transversal filter 120 includes a first transversal SAW filter 121 which performs convolution integration with an even-symmetry impulse response to generate a real component 120-I of the transformed complex signal and a second transversal SAW filter 126 which performs convolution integration with an odd-symmetry impulse response to generate an imaginary component 120-Q of the transformed complex signal.

The first SAW filter 121 includes an input-stage transducer 122, an output-stage transducer 123, an input terminal I-1, ground terminals I-2 and I-3, and output terminals I-4 and I-5. The second SAW filter 126 includes an input-stage transducer 127, an output-stage transducer 128, an input terminal Q-1, ground terminals Q-2 and Q-3, and output terminals Q-4 and Q-5.

In the first SAW filter, the input-stage transducer 122 generates a SAW signal from an electrical signal amplified by the LNA 112, and the output-stage transducer 123 has an even-symmetry impulse response, so that the real component of the complex RF signal is generated by performing convolution integration on the SAW signal. The first SAW filter 121 outputs the real component of the complex signal obtained from the input signal.

The input-stage transducer 122 has one input terminal I-1 and two transducers 122a and 122b. As shown in FIG. 2, the IDT is disposed on the piezoelectric substrate, and the intersection widths of fingers of the IDT are designed to vary according to the positions thereof.

The two transducers 122a and 122b in the input-stage transducer 122 have the same structure and are connected in parallel to each other in line symmetry with respect to in the signal transmission direction. In addition, the two transducers 122a and 122b have common ground terminals I-2 and I-3.

When an electrical signal is applied to the input-stage transducer 122, mechanical distortion occurs on the transducer due to piezoelectricity, which excites the two transducers 122a and 122b to generate the SAWs 124a and 124b, which are propagated in the left and right directions of the piezoelectric substrate 129 toward the output-stage transducer 123, which will now be described.

The output-stage transducer 123 includes two transducers 123a and 123b and two output terminals I-4 and I-5. As shown in FIG. 2, the output-stage transducers 123a and 123b have the same structure and are connected to each other in parallel (in the same direction) in a direction perpendicular to the signal transmission direction.

The two output transducers 123a and 123b are connected to a (+) output terminal I-4 and a (−) output terminal I-5, which output the real component and are disposed at positions for receiving the SAWs 124a and 124b from the input-stage transducer 122. The output signals from the output-stage transducers 123a and 123b are output in a balance mode from the (+) output terminal I-4 and the (−) output terminal I-5.

The output-stage transducer 123 which is connected to the output terminals I-4 and I-5 for outputting the real component 120-I of the complex signal have electrode fingers having even symmetry with respect to a center of an envelope in order to perform weighting corresponding to an impulse response of the real component.

The output-stage transducer 123 according to an exemplary embodiment of the present invention is driven in a balance mode. Unlike a single mode where one ground and one input terminal are provided, in the balance mode according to an exemplary embodiment of the present invention, one ground and (+) and (−) terminals are provided. In the structure of the complex coefficient transversal filter which is driven in the balance mode, since there is symmetry between the (+) output terminal I-4 and the (−) output terminal I-5 with respect to the input terminal I-1, it is possible to effectively remove common mode noise. For example, in such a symmetric structure, since parasitic capacitances C1+ and C1− between the input and output terminals become substantially equal, electromagnetic feed-through waves which are propagated from the input-stage transducer to the output stage transducer along the side of the piezoelectric device can cancel each other out. In an exemplary implementation, units which can add or subtract outputs from the terminals I-1 and I-2 are further provided, so that noise components, that is, signal components other than a target signal caused by a parasitic component commonly occurring at the terminals I-1 and I-2, can be cancelled.

In the second SAW filter 126, the input-stage transducer 127 generates the SAW signal from the electrical signal amplified by the LNA, and the output-stage transducer 128 has the odd-symmetry impulse response, so that the imaginary component of the complex RF signal is generated by performing convolution integration of the SAW signal. The second SAW filter 126 outputs the imaginary component of the complex signal obtained from the input signal.

The input-stage transducer 127 has one input terminal Q-1 and two transducers 127a and 127b. The transducers 127a and 127b are connected to each other in parallel with line symmetry of the signal transmission direction and have common ground terminals Q-2 and Q-3. When an electrical signal is applied to the input-stage transducer 127, mechanical distortion occurs, which excites the two transducers 127a and 127b to generate the SAWs 124c and 124d, which are propagated in the left and right directions of the piezoelectric substrate 129 toward the output-stage transducer 128, which will now be described.

The output-stage transducer 128 includes two transducers 128a and 128b. The two transducers 128a and 128b have the same structure and are connected in parallel in a direction perpendicular to the signal transmission direction. The two output-stage transducers 128a and 128b have a (+) output terminal Q-4 and a (−) output terminal Q-5 which output the imaginary component. The output-stage transducers 128a and 128b are disposed at positions for receiving the SAWs 124c and 124d from the input-stage transducers 127a and 127b. The output-stage transducers 128a and 128b have electrode fingers having odd-symmetry with respect to a center of an envelope in order to perform weighting which corresponds to an impulse response of the imaginary component. Due to such a construction of the electrode fingers, an imaginary signal having a phase difference from the component can be obtained from a real RF signal.

The output signals of the output-stage transducers are output from the (+) output terminal Q-4 and the (−) output terminal Q-5 in the balance mode. In the structure of the output-stage transducer, symmetry exists between the (+) output terminal Q-4 and the (−) output terminal Q-5 with respect to the input terminal Q-1. Due to such a symmetric structure, a capacitance C2+ between the input terminal and the (+) output terminal and a capacitance C2− between the input terminal and the (−) output terminal are substantially the same. As a result, it is possible to cancel feed-through waves caused by the capacitances C2+ and C2.

Due to such a structure, the feed-through waves (in-phase components) at the I and Q channels are cancelled. Therefore, the phase difference between the I and Q channels is not shifted from 90°, so that a desired characteristic can be obtained.

Now, operations of the complex coefficient transversal filter 120 according to an exemplary embodiment of the present invention are described.

When an electrical signal is applied to the input-stage, the SAW signals 124, that is, mechanical signals, are generated by the input-stage transducers 122 and 127. The SAW signals 124 propagated from the input-stage transducers 122 and 127 are received by the output-stage transducers 123 and 128 which are disposed in the SAW signal propagation path. After convolution integration of the SAW signals 124 using impulse responses thereof, an electrical signal having a complex coefficient is output from the output terminal.

The output-stage transducer 123 performs convolution integration on the input signal with the even-symmetry impulse response and outputs the real component 120-I of the complex coefficient through the output terminals I-4 and I-5. The output-stage transducer 128 performs convolution integration on the input signal with the odd-symmetry impulse response and outputs the imaginary component 120-Q of the complex coefficient through the output terminals Q-4 and Q-5. A curve formed according to an interval of the fingers of the output-stage transducer 123 for the real component is designed to correspond to the impulse response for the real component. A curve formed according to an interval of the fingers of the output-stage transducer 128 for the imaginary component is designed to correspond to the impulse response for the imaginary component. The SAW signal input to the output-stage transducers is subject to weighting in a predetermined time interval due to each finger of the output-stage transducers, which is equivalent to the convolution integration.

Figure 3:
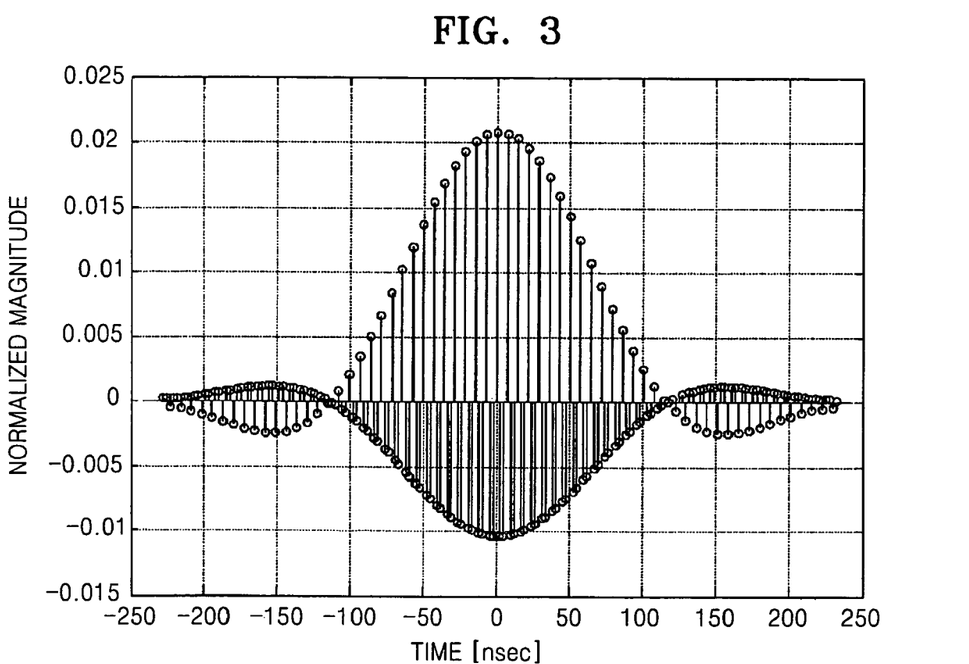
FIG. 3 shows a real impulse response of a complex coefficient transversal filter according to an exemplary embodiment of the present invention.

FIG. 3 shows the impulse response of the first SAW filter according to an exemplary embodiment of the present invention shown in FIG. 2. As shown in FIG. 3, the impulse response of the first SAW filter has even-symmetry with respect to a center of the impulse response.

Figure 4:
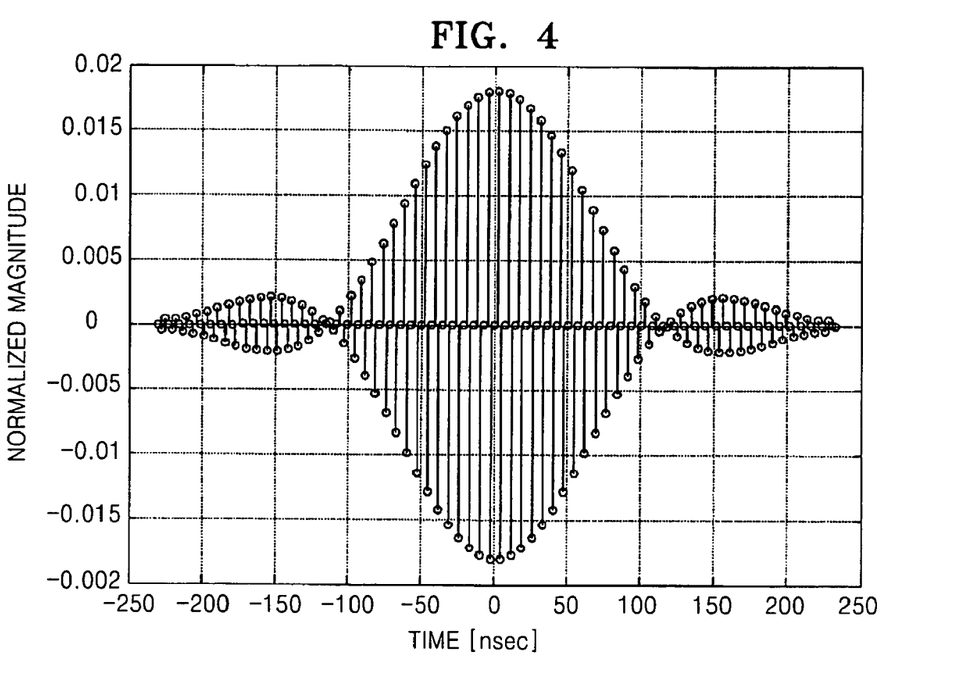
FIG. 4 shows an imaginary impulse response of a complex coefficient transversal filter according to an exemplary embodiment of the present invention.

FIG. 4 shows the impulse response of the first SAW filter according to an exemplary embodiment. As shown in FIG. 4, the impulse response of the second SAW filter has odd-symmetry with respect to a center of the impulse response.

Figure 5:
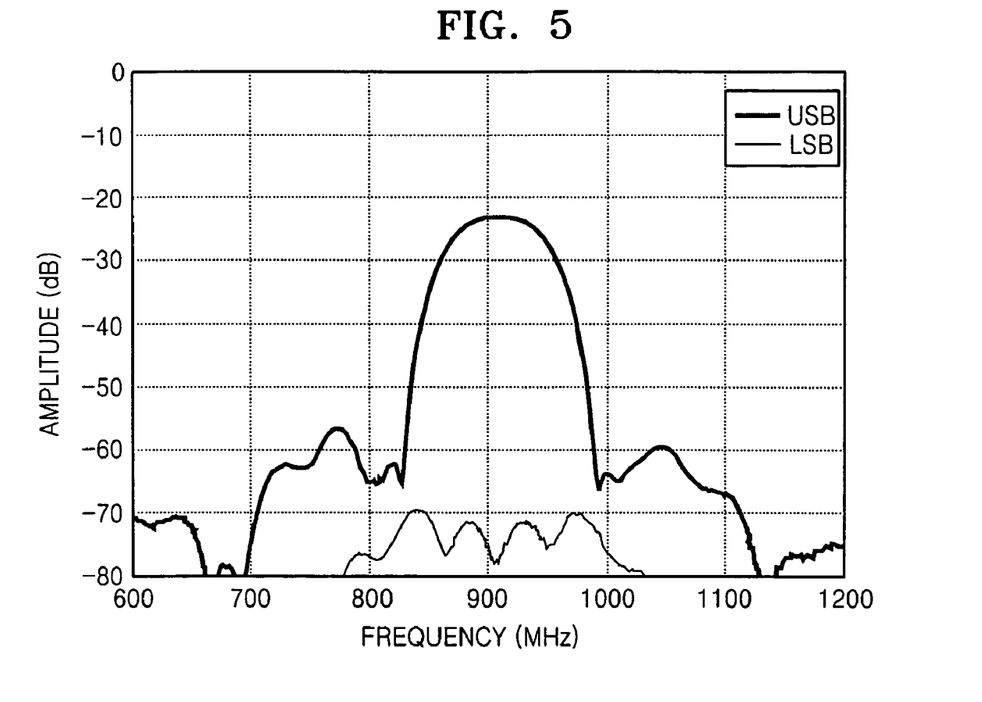
FIG. 5 shows an image compression characteristic of a complex coefficient transversal filter according to an exemplary embodiment of the present invention.

FIG. 5 shows an image suppression characteristic (attenuation characteristic of a negative frequency band) of the complex coefficient transversal filter 120 according to an exemplary embodiment.

In FIG. 5, USB denotes a frequency characteristic of a positive frequency band, and LSB denotes a frequency characteristic of a negative frequency band. In the figure, both of the image suppression characteristics of the positive and negative frequency bands are represented using the absolute value of the frequencies. As shown in FIG. 5, the image suppression ratio in the negative frequency band can be designed to have a value of 40 dB or more, which is desirable. Due to the structure according to an exemplary embodiment of the present invention, the feed-through wave can be suppressed so that a desired characteristic can be obtained.

Figure 6:
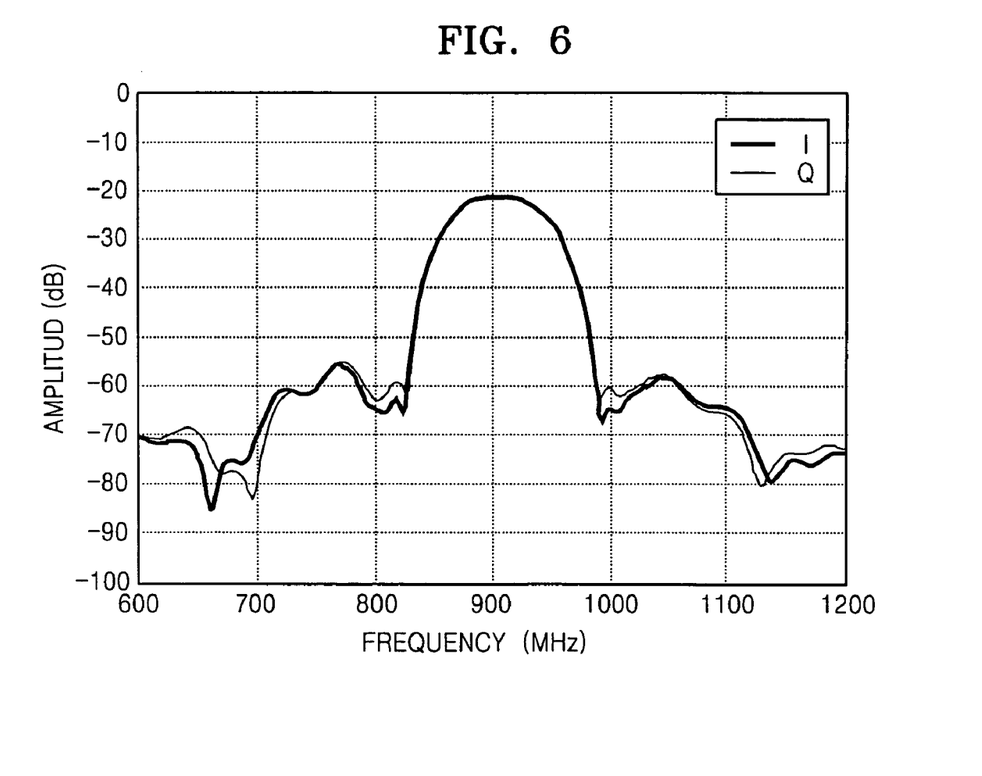
FIG. 6 is a view for explaining a difference in amplitude between I output and Q output according to an exemplary embodiment of the present invention.
Figure 7:
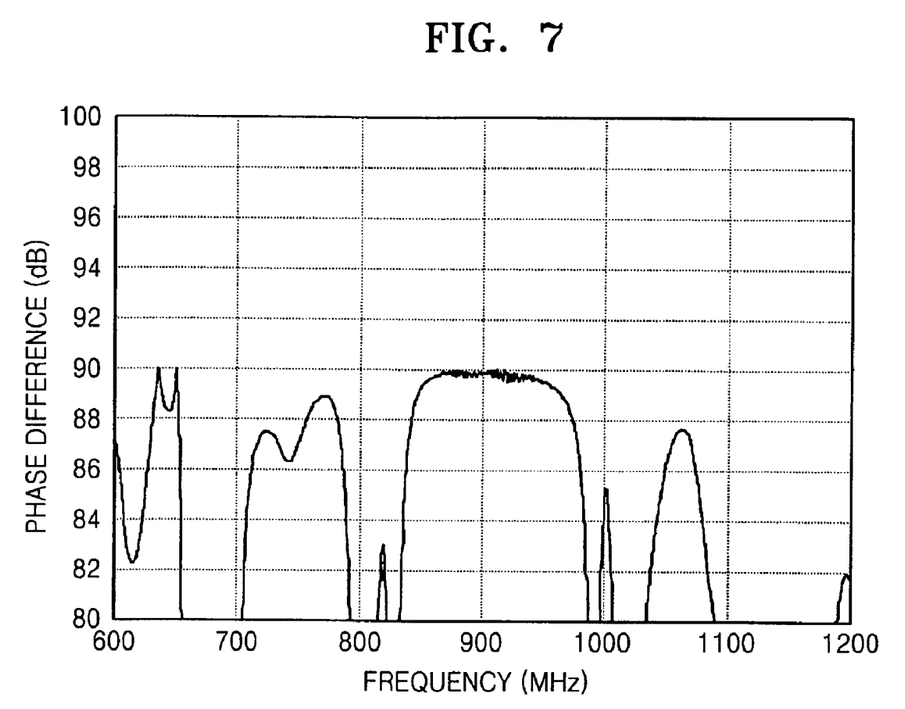
FIG. 7 is a view for explaining a difference in phase between I output and Q output according to an exemplary embodiment of the present invention.

FIG. 6 shows a difference in amplitude between the outputs of the I and Q channels according to the complex coefficient transversal filter of FIG. 2. FIG. 7 shows a difference in phase between the outputs of the I and Q channels according to an exemplary embodiment of the present invention.

As shown in FIGS. 6 and 7, it is possible to obtain a complex coefficient transversal filter having a difference in phase between the output signals of the I and Q channels of 90° and an image suppression ratio in the negative frequency which can be designed to have a value of 40 dB or more, which is desirable.

The parasitic capacitance between the input and output terminals of the complex coefficient transversal filter includes capacitance between wire patterns and capacitance between wire pads as well as the capacitance between the transducers. In order to solve a problem caused by the parasitic capacitance, one of the input-stage and the output-stage is driven in the balance mode. If both of the input and output stages are driven in the single mode like a conventional complex coefficient transversal filter, although the complex coefficient transversal filter is designed for the phase difference between the I and Q channels to be 90°, the feed-through wave between the input and output terminals shifts the phase difference between the I and Q channels from 90°, which is a desired phase difference. Therefore, desired performance cannot be obtained.

As shown in FIG. 2, in the complex coefficient transversal filter 120 according to an exemplary embodiment of the present invention, the upper and lower transducers having the same structure are connected to each other in parallel in line symmetry in the opposite direction, and the two transducers are connected in series in the same direction at the output stage. The input-stage transducers are driven in the single mode, and the output-stage transducers are driven in the balance mode. In such a driving structure, that is, the single/balance driving structure, the feed-through waves propagating toward the terminals of the balance-driving stage cancelled each other out so that it is possible to obtain a filter capable of maintaining the phase difference between the signals of the I and Q channels at 90°, suppressing the negative frequency, and improving the suppression ratio for signals other than a target signal in the frequency band where the target signal exists. In addition, a low-IF frequency converter implemented using the complex coefficient transversal filter according to an exemplary embodiment of the present invention shown in FIG. 2 may have a good image suppression ratio, and a zero-IF frequency converter implemented using the complex coefficient transversal filter may have a good error vector magnitude (EVM) characteristic.

Figure 8:
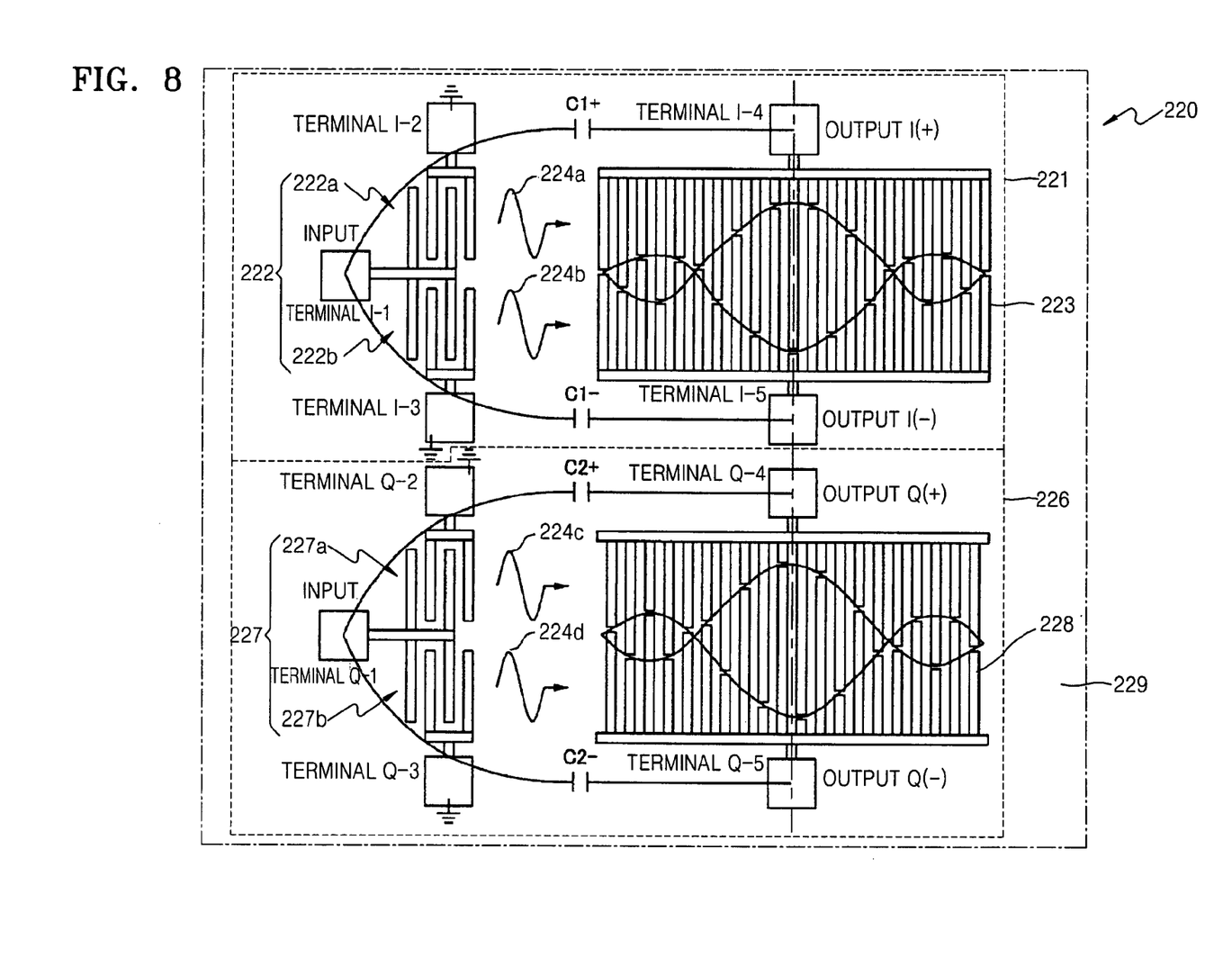
FIG. 8 is a view showing a construction of a complex coefficient transversal filter according to an exemplary embodiment of the present invention.

FIG. 8 is a view showing a construction of a complex coefficient transversal filter 220 according to an exemplary embodiment of the present invention.

The complex coefficient transversal filter according to an exemplary embodiment of the present invention shown in FIG. 8 includes a first SAW filter 221 which generates a real component of a complex RF signal by performing convolution integration on an input RF signal and an even-symmetry impulse response and a second SAW filter 226 which generates an imaginary component of the complex RF signal by performing convolution integration on the input RF signal and an odd-symmetry impulse response.

The complex coefficient transversal filter of FIG. 8 is a modification of the complex coefficient transversal filter of FIG. 2. In FIG. 8, one transducer is disposed at an output stage, and the output-stage transducer is driven in a balance mode. A description of FIG. 8 will be described in detail below.

As shown in FIG. 8, the complex coefficient transversal filter 220 includes a piezoelectric substrate 229, and first and second SAW filters 221 and 226. Each of the SAW filters includes transducers 222, 223, 227, and 228 whose intersection widths are different, and input and output terminals on the piezoelectric substrate 229.

The input-stage transducer 222 of the first SAW filter 221 includes two transducers 222a and 222b and has substantially the same structure as that of the input-stage transducer 122 of FIG. 2. Similarly, the input-stage transducer 227 of the second SAW filter 226 includes two transducers 227a and 227b and has substantially the same structure as that of the input-stage transducer 127 of FIG. 2.

Unlike the output-stage transducers 123 and 128 of FIG. 2 where each of the output-stage transducers are divided into two transducers, each of the output-stage transducers 223 and 228 of the complex coefficient transversal filter of FIG. 8 is constructed with one transducer.

The output-stage transducer 223 of the first SAW filter 221 has a (+) output terminal I-4 and a (−) output terminal I-5 which output a real component. The output-stage transducer 223 is disposed at a position for receiving the SAWs 224a and 224b from the input-stage transducer 222. The output-stage transducer 223 outputs the real signal of the complex signal in the balance mode through the (+) output terminal I-4 and the (−) output terminal I-5.

The output-stage transducer 228 of the second SAW filter 226 also has a (+) output terminal Q-4 and a (−) output terminal Q-5, which output an imaginary component and are disposed at positions for receiving the SAWs 224c and 224d from input-stage transducer 227. The output signal from the output-stage transducer 228 is output in the balance mode through the (+) output terminal Q-4 and the (−) output terminal Q-5.

According to the complex coefficient transversal filter 220 of FIG. 8, advantages similar to those of FIG. 2 can be obtained. The (+) output terminal and the (−) output terminal are disposed in symmetry with respect to the input terminal, so that capacitances between the input and output stages are the same. Therefore, similarly to FIG. 2, feed-through waves can be cancelled.

Figure 9:
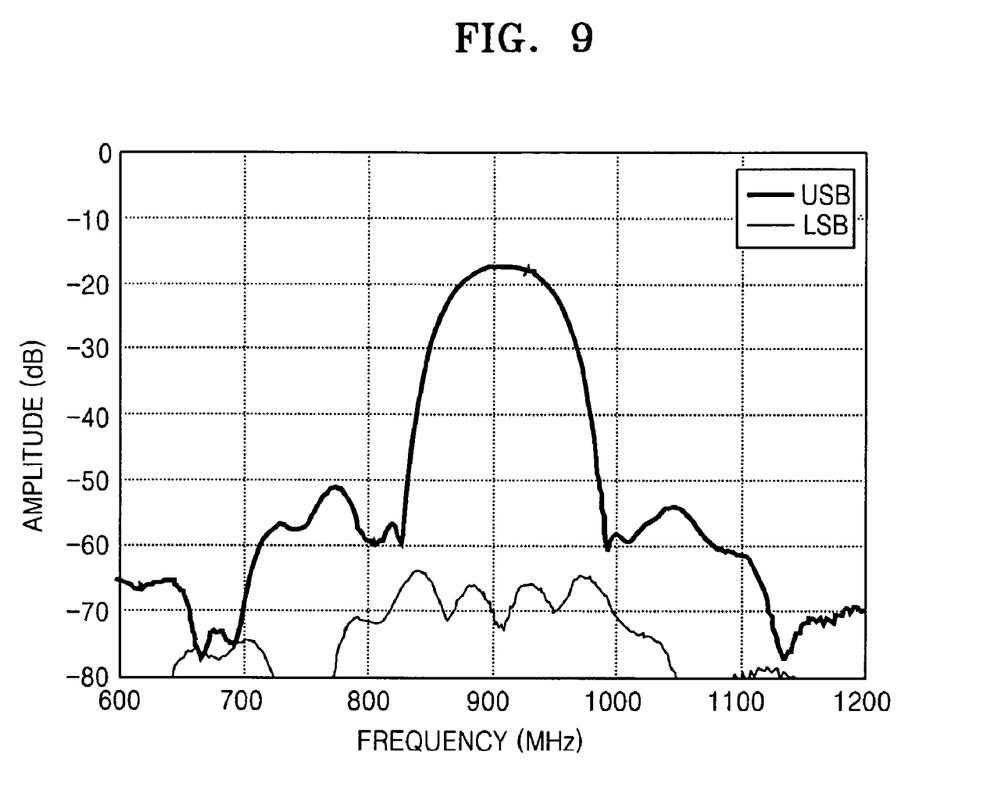
FIG. 9 shows an image compression characteristic of a complex coefficient transversal filter according to an exemplary embodiment of the present invention.

FIG. 9 shows an image suppression characteristic (attenuation characteristic of a negative frequency band) of the complex coefficient transversal filter 220 according to an exemplary embodiment of the present invention as shown in FIG. 8.

In FIG. 9, USB denotes a frequency characteristic of a positive frequency band, and LSB denotes a frequency characteristic of a negative frequency band. In FIG. 9, both of the image suppression characteristics of the positive and negative frequency bands are represented by using the absolute value of the frequencies. As shown in FIG. 9, in the complex coefficient transversal filter according to an exemplary embodiment of the present invention, the image suppression ratio in the negative frequency band have a value of 40 dB or more, which is desirable. Due to the structure, the feed-through wave can be suppressed so that a desired characteristic can be obtained.

In the complex coefficient transversal filter of FIG. 2, since impedance mis-matching caused by two transducers used at the output stage increases insertion loss, the impedance of the output stage and the input impedance at the mixer need to be matched. However, in the complex coefficient transversal filter of FIG. 8, since an additional transducer is not provided, the impedance need not be adjusted.

In FIG. 8, a wire pattern is also required at the center of the input-stage transducer where the SAW is not excited. In the output-stage transducer, a central portion where the SAW is not propagated becomes a load so that propagation efficiency may be lowered. Therefore, FIGS. 2 and 8 may be selected according to the specifications and purpose of a system.

Complex coefficient transversal filters according to exemplary embodiments of the present invention are described with reference to the accompanying drawings, but are not limited thereto.

For example, in the exemplary embodiments of the present invention described above, the transducers on the left side of FIGS. 2 and 8 are the input-stage transducers, and the transducers on the right side thereof are output-stage transistors. But, the exemplary embodiments of the present invention are not limited thereto. For example, the transducers on the right side of FIGS. 2 and 8 may be the input-stage transducers, and the transducers on the left side may be output-stage transistors in order to obtain the same advantages.

Figure 10:
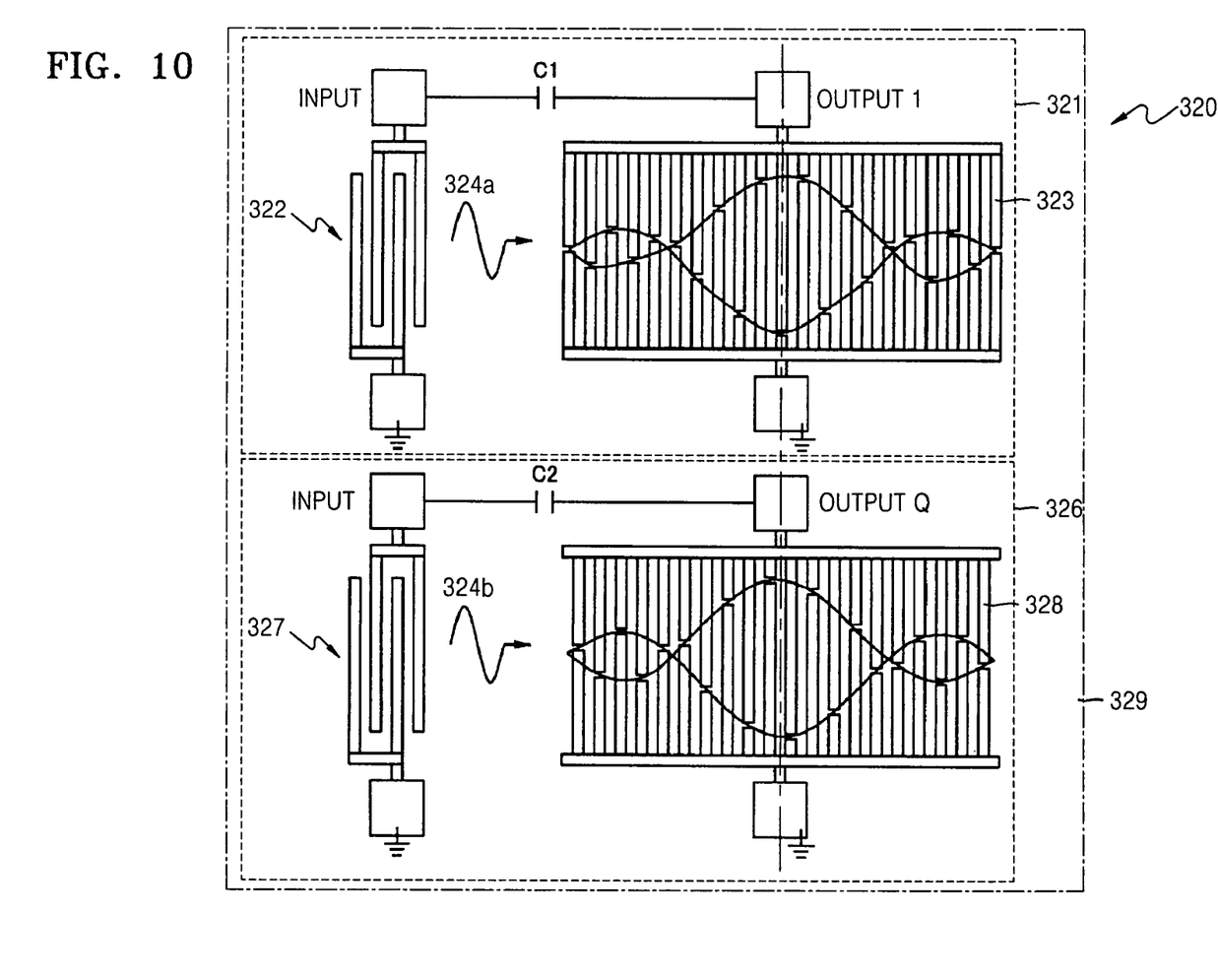
FIG. 10 is a view showing a construction of a transversal filter according to an exemplary embodiment of the present invention.

FIG. 10 shows a construction of a complex coefficient transversal filter according to an exemplary embodiment of the present invention. The complex coefficient transversal filter (not published) includes two real coefficient transversal SAW filters on the same substrate.

Similar to the complex coefficient transversal filters of FIGS. 2 and 8, the complex coefficient transversal filter 320 includes a first SAW filter 321, a second SAW filter 326, and a piezoelectric substrate 329. Input-stage transducers 322 and 327 of the first and second SAW filters receive real signals simultaneously and generate SAWs 324a to 324d. An output transducer 323 performs weighting corresponding to an impulse response of a real component, and another output transducer 328 performs weighting corresponding to an impulse response of an imaginary component.

In the complex coefficient transversal filter, the impulse response of the real component is output through an output terminal, and impulse response of the imaginary component is output through another output terminal.

In the complex coefficient transversal filter of FIG. 10, an input stage is driven in a single mode, and the output stage is driven in a single mode. In the complex coefficient transversal filter, the electrical capacitance between the input and output includes capacitance between wire patterns and capacitance between wire pads as well as the capacitance between the transducers. In such a structure, a feed-through wave D1 caused by a capacitance C1 between the input and output of an I channel and a feed-through wave D2 caused by the input and the output of a Q channel are output in-phase.

Therefore, although the complex coefficient transversal filter is designed for the phase difference between the I and Q channels to be 90°, parasitic components such as the feed-through waves applied in phase shifts, the phase difference from 90°, so that desired performance cannot be obtained.

Figure 11:
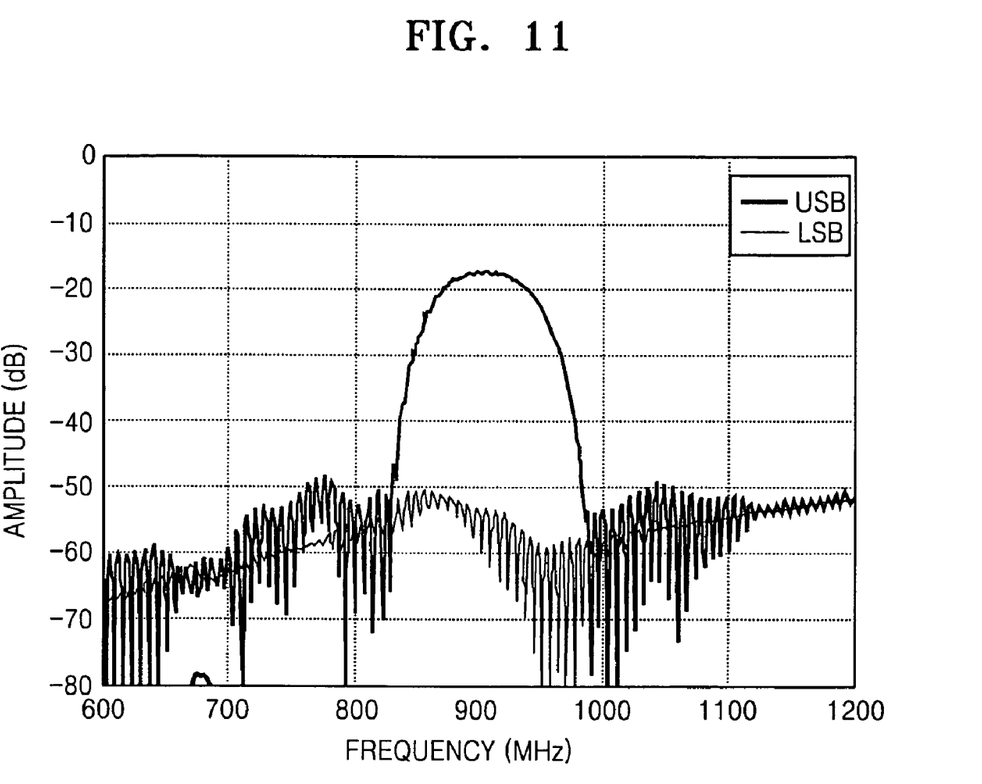
FIG. 11 is a view for explaining a result of measurement of an image suppression characteristic according to an exemplary embodiment of the present invention shown in FIG. 10.

FIG. 11 shows an image suppression characteristic (attenuation characteristic of a negative frequency band) of the complex coefficient transversal filter shown in FIG. 10.

In FIG. 11, USB denotes a frequency characteristic of a positive frequency band, and LSB denotes a frequency characteristic of a negative frequency band. In FIG. 11, both of the image suppression characteristics of the positive and negative frequency bands are represented using the absolute value of the frequencies.

As shown in FIG. 11, the image suppression ratio of the complex coefficient transversal filter where the input and output stages are driven in the single mode is about 33 dB, which is about 10 dB lower than a design value. However, in the complex coefficient transversal filter 120 according to an exemplary embodiment of the present invention, since the parasitic capacitances between the input and the output are the same, the feed-through waves can be cancelled so that a desired image suppression characteristic (that is, an image suppression ratio of 40 dB or more) can be obtained.

In a complex coefficient transversal filter according to exemplary embodiments of the present invention, since an input or output stage is driven in a balance mode, feed-through waves between the input and output stages can be cancelled, and a phase difference between real and imaginary signals can be maintained at 90° without a phase shift. In addition, when a low-IF frequency converter is implemented using the complex coefficient transversal filter according to exemplary embodiments of the present invention, an image suppression characteristic is improved. When a zero-IF frequency converter is implemented using the complex coefficient transversal filter according to the present invention, an EVM characteristic is improved.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claim is:

1. A complex coefficient transversal filter comprising:
   a first surface acoustic wave (SAW) filter for receiving a real signal as an input signal and generating a real component of a complex signal; and
   a second SAW filter for receiving the real signal as an input signal and generating an imaginary component of the complex signal,
   wherein the first and second SAW filters drive at least one of an input stage for the real signal and an output stage for the complex signal in a balance mode to prevent phase shifting of the real signal and the imaginary signal,
   wherein the first and second SAW filters each includes two input-stage transducers which are disposed in line symmetry with respect to an input signal transmission direction and one output-stage transducer which is disposed in a direction perpendicular to an output signal transmission direction and two output-stage transducers which are disposed in parallel to each other in a direction perpendicular to the output signal transmission direction, and
   wherein the input-stage transducers are driven in a single mode and the output-stage transducer is driven in the balance mode.

2. The complex coefficient transversal filter of claim 1, wherein the first and second SAW filters each includes input-stage and output-stage transducers,
   wherein at least one of the input-stage and output-stage transducers of the first SAW filter comprises an even-symmetry impulse response, and the at least one of the input-stage and output-stage transducers of the second SAW filter comprises an odd-symmetry impulse response.

3. The complex coefficient transversal filter of claim 1, wherein the first SAW filter generates the real component of the complex signal by performing convolution integration using at least one of the input-stage and output-stage transducer comprising an even-symmetry impulse response, and
   wherein the second SAW filter generates the imaginary component of the complex signal by performing convolution integration using the at least one of the input-stage and output-stage transducer comprising an odd-symmetry impulse response.

4. The complex coefficient transversal filter of claim 1, wherein the first and second SAW filters each are constructed by disposing two transducers in line symmetry and in opposite directions to each other at one of the input-stage and the output-stage, and disposing two transducers in the same direction at the other stage.

5. The complex coefficient transversal filter of claim 1, wherein the first and second SAW filters further each comprise a noise remover for removing noise by adding or subtracting signals from transducers which are driven in the balance mode.

6. The complex coefficient transversal filter of claim 1, wherein the first and second SAW filters each comprise the same capacitance between an output terminal of an output-stage transducer and an input terminal of an input-stage transducer.

7. A complex frequency converter comprising:
   a complex coefficient transversal filter including a first surface acoustic wave (SAW) filter for receiving a real signal as an input signal and generating a real component of a complex signal, and a second SAW filter for receiving the real signal as an input signal and generating an imaginary component of the complex signal, wherein the first and second SAW filters drive at least one of an input stage for the real signal and an output stage for the complex signal in a balance mode to prevent phase shifting of the real signal and the imaginary signal;

a local oscillator for generating a complex local signal comprising a reference frequency; and a complex mixer connected to the complex coefficient transversal filter and the local oscillator for performing frequency conversion by multiplying the complex signal output from the complex coefficient transversal filter with the local signal output from the local oscillator, wherein the first and second SAW filters each includes two input-stage transducers which are disposed in line symmetry with respect to an input signal transmission direction and one output-stage transducer which is disposed in a direction perpendicular to an output signal transmission direction and two output-stage transducers which are disposed in parallel to each other in a direction perpendicular to the output signal transmission direction, and wherein the input-stage transducers are driven in a single mode and the output-stage transducer is driven in the balance mode.

8. The complex frequency converter of claim 7, wherein the first SAW filter generates the real component of the complex signal by performing convolution integration using at least one of an input-stage and output-stage transducer comprising an even-symmetry impulse response, and wherein the second SAW filter generates the imaginary component of the complex signal by performing convolution integration using at least one of an input-stage and output-stage transducer comprising an odd-symmetry impulse response.

9. The complex frequency converter of claim 7, wherein the local oscillator generates a complex local signal whose frequency comprises a frequency range excluding a frequency of the input signal.

10. The complex frequency converter of claim 7, wherein the complex mixer comprises:

a first multiplier for multiplying a real component from the local oscillator with a real component from the complex coefficient transversal filter;

a second multiplier for multiplying an imaginary component from the local oscillator with an imaginary component from the complex coefficient transversal filter;

a third multiplier for multiplying the real component from the local oscillator with the imaginary component from the complex coefficient transversal filter; and a fourth multiplier for multiplying the imaginary component from the local oscillator with the real component from the complex coefficient transversal filter.

11. The complex frequency converter of claim 10, wherein the complex mixer further comprises:

a first adder for adding an output of the first multiplier to an output of the second multiplier; and a second adder for adding an output of the third multiplier to an output of the fourth multiplier.

12. A complex frequency converter comprising:

a complex coefficient transversal filter comprising a first surface acoustic wave (SAW) filter for receiving a real signal as an input signal and generating a real component of a complex signal, and a second SAW filter for receiving the real signal as an input signal and generating an imaginary component of the complex signal, wherein the first and second SAW filters drive at least one of an input stage for the real signal and an output stage for the complex signal in a balance mode to prevent phase shifting of the real signal and the imaginary signal, wherein the first and second SAW filters each includes two input-stage transducers which are disposed in line symmetry with respect to an input signal transmission direction and one output-stage transducer which is disposed in a direction perpendicular to an output signal transmission direction and two output-stage transducers which are disposed in parallel to each other in a direction perpendicular to the output signal transmission direction, and wherein the input-stage transducers are driven in a single mode and the output-stage transducer is driven in the balance mode.

13. The complex frequency converter of claim 12, further comprising:

a local oscillator for generating a complex local signal comprising a reference frequency; and a complex mixer connected to the complex coefficient transversal filter and the local oscillator for performing frequency conversion by multiplying the complex signal output from the complex coefficient transversal filter with the local signal output from the local oscillator.

14. The complex frequency converter of claim 12, wherein the first SAW filter generates the real component of the complex signal by performing convolution integration on an input radio frequency (RF) signal and an even-symmetry impulse response, and the second SAW filter generates the imaginary component of the complex signal by performing convolution integration on the input RF signal and an odd-symmetry impulse response.

15. The complex frequency converter of claim 12, wherein the first and second SAW filters each comprise two input-stage transducers that are disposed in opposite directions to each other, driven in the single mode.

16. The complex frequency converter of claim 12, wherein the output-stage transducer of the first SAW filter performs weighting corresponding to an impulse response of the real component and the output-stage transducer of the second SAW filter performs weighting corresponding to an impulse response of the imaginary component.

17. The complex frequency converter of claim 13, wherein the local oscillator generates a complex local signal whose frequency comprises a frequency range excluding a frequency of the input signal.

18. The complex frequency converter of claim 13, wherein the complex mixer comprises:

a first multiplier for multiplying a real component from the local oscillator with a real component from the complex coefficient transversal filter;

a second multiplier for multiplying an imaginary component from the local oscillator with an imaginary component from the complex coefficient transversal filter;

a third multiplier for multiplying the real component from the local oscillator with the imaginary component from the complex coefficient transversal filter; and a fourth multiplier for multiplying the imaginary component from the local oscillator with the real component from the complex coefficient transversal filter.

19. The complex frequency converter of claim 18, wherein the complex mixer further comprises:

a first adder for adding an output of the first multiplier to an output of the second multiplier; and a second adder for adding an output of the third multiplier to an output of the fourth multiplier.

* * * * *